United States Patent [19]

Orgami et al.

[11] Patent Number: 5,430,271
[45] Date of Patent: Jul. 4, 1995

[54] METHOD OF HEAT TREATING A SUBSTRATE WITH STANDBY AND TREATMENT TIME PERIODS

[75] Inventors: Nobutoshi Orgami; Yoshiteru Fukutomi, both of Kyoto, Japan

[73] Assignee: Dainippon Screen Mfg. Co., Ltd., Kyoto, Japan

[21] Appl. No.: 165,531

[22] Filed: Dec. 13, 1993

Related U.S. Application Data

[63] Continuation of Ser. No. 713,785, Jun. 12, 1991, abandoned.

[30] Foreign Application Priority Data

Jun. 12, 1990 [JP] Japan .................. 1-154921

[51] Int. Cl.⁶ .............................................. H01L 21/68
[52] U.S. Cl. ........................... 219/388; 392/418; 118/724; 414/935; 414/152
[58] Field of Search ............... 219/390, 388, 405, 411; 392/416, 418; 118/724, 725, 727, 50.1; 432/259; 437/247, 248; 414/935, 939, 937, 152, 404

[56] References Cited

U.S. PATENT DOCUMENTS

| | | | |
|---|---|---|---|
| 3,830,194 | 8/1974 | Benzing et al. | 118/725 |
| 4,178,113 | 12/1979 | Beaver, II et al. | 414/937 |
| 4,388,034 | 6/1983 | Takahashi | 414/939 |
| 4,542,712 | 9/1985 | Sato | 118/729 |
| 4,669,938 | 6/1987 | Hayward | 414/156 |
| 4,699,554 | 10/1987 | Kawashima et al. | 414/939 |
| 4,770,590 | 9/1988 | Hughes et al. | 414/172 |
| 4,778,382 | 10/1988 | Sakashita | 432/239 |
| 4,820,907 | 4/1989 | Terauchi et al. | 219/491 |
| 4,831,909 | 7/1985 | Takeshita | 414/147 |
| 4,840,530 | 6/1989 | Nguyen | 414/404 |
| 4,938,691 | 6/1990 | Ohkase et al. | 432/239 |
| 4,955,775 | 9/1990 | Ohkase et al. | 414/152 |
| 4,962,726 | 10/1990 | Matsushita et al. | 414/939 |
| 5,009,590 | 4/1991 | Mitarai et al. | 432/121 |
| 5,034,199 | 7/1991 | Zavracky | 219/405 |
| 5,048,164 | 9/1991 | Harima | 414/404 |
| 5,058,526 | 10/1991 | Matsushita et al. | 414/937 |
| 5,089,441 | 2/1992 | Moslehi | 437/247 |
| 5,177,514 | 1/1993 | Ushijima et al. | 414/937 |
| 5,277,579 | 1/1994 | Takanabe | 414/939 |

FOREIGN PATENT DOCUMENTS

| | | | |
|---|---|---|---|
| 63-176476 | 7/1988 | Japan | 118/725 |
| 1-49010 | 10/1989 | Japan . | |
| 2-34789 | 2/1990 | Japan | 118/725 |
| 2-288139 | 11/1990 | Japan | 414/937 |
| 3-135011 | 6/1991 | Japan | 437/247 |
| 2137414 | 10/1984 | United Kingdom . | |
| 8904386 | 5/1989 | WIPO . | |

*Primary Examiner*—John A. Jeffery
*Attorney, Agent, or Firm*—Ostrolenk, Faber, Gerb & Soffen

[57] ABSTRACT

A method of heat-treating a substrate to be loaded/unloaded to and from a substrate heating device for a prescribed time period cycle including the steps of transferring the substrate from a substrate conveying robot to a substrate transferring and receiving device, holding the received substrate in a position where it is subjected to only a limited influence of heating by a hot plate for a first time period prior to transferring the substrate to the hot plate, heating the substrate by the hot plate for a second time period, and removing the substrate from the hot plate by the substrate conveying robot after the second time period elapses. Preferably, the sum of the first time period and the second time period approximately equals the cycle time period.

20 Claims, 7 Drawing Sheets

METHOD OF HEAT TREATING A SUBSTRATE WITH STANDBY AND TREATMENT TIME PERIODS

This is a continuation of application Ser. No. 07/713,785, filed Jun. 12, 1991, now abandoned.

BACKGROUND OF THE INVENTION

1. Field of the Invention

The present invention relates generally to a method of heat treatment of a substrate, and more specifically to a method of heat treatment in a heat treatment unit in a substrate treatment apparatus including a plurality of substrate treatment units including the heat treatment unit and a self-propelled substrate conveying robot for traveling around the treatment units to convey a substrate thereto.

2. Description of the Related Art

Heat treatment of semiconductor substrates (referred to simply as "substrate" hereinafter) plays an important role in manufacturing a semiconductor device. Heat-treating of photoresist applied on the surface of a substrate in the process of photolithography for forming wirings into a desired form on the surface of the substrate, for example, has significant effects on the accuracy of wiring patterning. Therefore, various kinds of apparatus have been employed for various kinds of treatment including heat-treatment of a large number of substrates efficiently.

Such a substrate treatment apparatus is for example used for washing a substrate, applying photoresist onto the surface of a substrate, developing and heating/drying the photoresist and the like. The substrate treatment apparatus therefore includes a plurality of substrate treatment units and heat treatment units, and a single self-propelled substrate conveying robot for conveying sequentially substrates to the substrate treatment units and the heat treatment units so that the substrate is sequentially conveyed to each unit at a cycle time T. The cycle time means a time period required for the robot to move round back to the same treatment unit, and a substrate disposed in each of the treatment units can be taken out only at this cycle time.

Heating a substrate for less than a prescribed heating time period t does not allow sufficient heat treatment of the substrate, resulting in for example a problem that the photoresist is not dried, and on the other hand heating the substrate for more than the prescribed heating time period t in the heat treatment unit causes overbaking, thereby deteriorating the sensitivity of the photoresist. Preferably, the substrate should be heated in a time period which corresponds to the prescribed heating time period. There will be no problem if the prescribed heating time corresponds to the cycle time in order to meet this end, but this is not usually the case in practice.

This is caused by the following reasons. The prescribed heating time period is determined by restrictions associated with the process, such as the chemical properties, film thickness, etc. of the photoresist. On the other hand, the cycle time period is determined by the mechanical restrictions of the self-propelled substrate conveying robot such as time required for the self-propelled substrate conveying robot to dispose and take out a substrate to and from each of the treatment units, a speed at which the robot move around the treatment units, etc. The two time periods are determined by the factors irrelevant to each other as mentioned above and therefore can not be expected to be the same.

However, if the prescribed heating time period is longer than the cycle time period, there will not be any problem because the cycle time can be set to be longer on purpose, and therefore this is not what the present invention is directed to.

There will be a problem, however, if the cycle time period is longer than the prescribed heating time period. In this case, a substrate disposed in the heat treatment unit cannot be taken out of the unit by the self-propelled substrate conveying robot until the end of the cycle time period after the prescribed heating time period elapses, and therefore it can not be helped that the substrate stays in the heat treatment unit. In that case, the substrate stays in the heat treatment units in an inappropriately long time period and can be subject to a danger of being overbaked. Danger of this kind should be eliminated.

Figure 1:
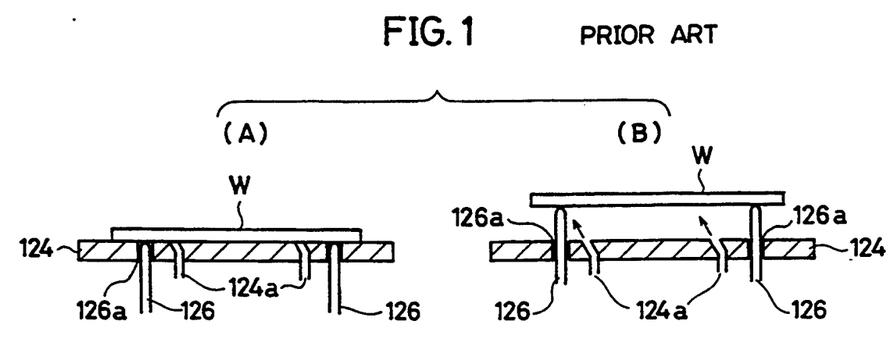

In order to achieve this purpose, a substrate heating apparatus as shown in FIG. 1 for example, is disclosed in Japanese Patent Publication No. 1-49010. Now, referring to FIG. 1, the substrate heating apparatus includes a hot plate 124 having cold air outlets 124a and through-holes 126a; substrate supporting pins 126 for supporting at their tip a substrate W and being moved up and down in the through-holes 126a by an air cylinder, etc. (not shown); a cold air supply device (not shown) for supplying a cold air from the cold air outlets 124a toward the bottom of the substrate W in a desired timing; and a controller (not shown) for controlling the air cylinder for moving the substrate supporting pin 126 up and down, the cold air supply device and the hot plate 124.

The substrate heating apparatus shown in FIG. 1 operates as follows. Referring to FIG. 1(A), the substrate supporting pins 126 are drawn into the through-holes 126a. When the substrate W is placed on the hot plate 124, heating of the substrate W by the hot plate 124 is initiated. The heating continues for a prescribed time period t.

After the time t elapses, the substrate supporting pins 126 elevate, and the substrate W is separated from the surface of the hot plate 124. Cold air is supplied from the cold air outlet 124a to the bottom of the substrate W at this time.

In the above-described conventional apparatus, the hot plate 124 is selectively cooled in the vicinity of the outlet 124a when the cold air passes through the outlet 124a at the hot plate 124, and the blown cold air diffuses unevenly on the surface of the hot plate 124 to cool the surface of the hot plate 124 unevenly, resulting in disparity in the temperature distribution of the hot plate. The distribution of the temperature at which a succeeding substrate is heated will therefore be uneven, deteriorating the quality of heat treatment applied to the substrate. Also, the cost for providing the cold air outlets 124a at the hot plate 124 has been high.

These problems have been obstacles to the heat treatment of substrates while preventing the overbaking and the unevenness in the treatment as well.

SUMMARY OF THE INVENTION

It is therefore an object of the present invention to provide a method of heat treatment of substrates, by which overbaking and unevenness in the treatment can be prevented.

It is another object of the present invention to provide a method of heat treatment of substrates, by which overbaking can be prevented without providing a cold air outlet at a hot plate and unevenness in treatment as well as cost increase can be prevented.

Yet another object of the present invention is to provide a method of heat treatment of substrates with little overbaking, without providing a costly device for supplying cold air to a hot plate.

An additional object of the present invention is to provide a method of heat treatment of substrates by which a heat quantity a substrate received from a hot plate before the end of a cycle time can be reduced, after heating a substrate for a prescribed time period.

By a method of heat treatment of a substrate in accordance with the present invention, the heat treatment of the substrate is performed in a substrate treatment apparatus including a substrate heat treatment unit for heat-treating the substrate and a substrate conveying robot for conveying and supplying the substrate sequentially in a prescribed cycle time period to the substrate heat treatment unit, to unload the substrate after the treatment. The substrate heat treatment unit includes a hot plate for heating the substrate to a prescribed temperature, and a substrate transferring and receiving apparatus for transferring and receiving the substrate between the substrate conveying robot and the hot plate. The method includes the steps of: conveying the substrate from the substrate conveying robot to the substrate transferring and receiving apparatus; holding the substrate which the substrate transferring and receiving apparatus received, in a state under little effect of heat by the hot plate, for a first time period shorter than the cycle time period prior to transferring the substrate to the hot plate; transferring the substrate from the substrate transferring and receiving apparatus to the hot plate to be heated by the hot plate for a second time period; and removing the substrate from the hot plate by the substrate transferring and receiving apparatus after the second time period elapses.

In the above-mentioned method, the substrate is kept in a state under a relatively small effect by the heat of the hot plate for the first time period. After the first time period elapses the substrate is subject to the heating by the hot plate for the second time period, and is then removed from the hot plate. As the substrate is kept in a stand-by state before being heated, the time period after the heating is completed and before the substrate is transferred to the next step is shorter than in the conventional method (supposing that the cycle time is constant). Overbaking by the hot plate after the heating is completed, or overbaking by the remaining heat of the substrate itself will be reduced compared to conventional methods, because time until the substrate is transferred to the next step after the heating is shortened. There is no necessity to provide cold air for cooling the hot plate, and unevenness in the temperature distribution of the hot plate is not generated, thereby eliminating the danger of adverse effects on the treatment of the substrate. Furthermore, there is no necessity for providing an apparatus for supplying cold air, so that the cost of the substrate treatment apparatus will not be unnecessarily increased.

The sum of the first time period and the second time period is preferably equal to one cycle time period. In this case, the time period after the completion of the heating before one cycle time is completed and the substrate is transferred to the next step, is reduced to almost zero. Therefore, a heat amount to be applied to the substrate after the heat treatment is minimized, thereby reducing the danger of overbaking.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1(A) and (B) is a sectional view schematically showing a hot plate of a conventional apparatus;

DESCRIPTION OF PREFERRED EMBODIMENTS

Figure 2:
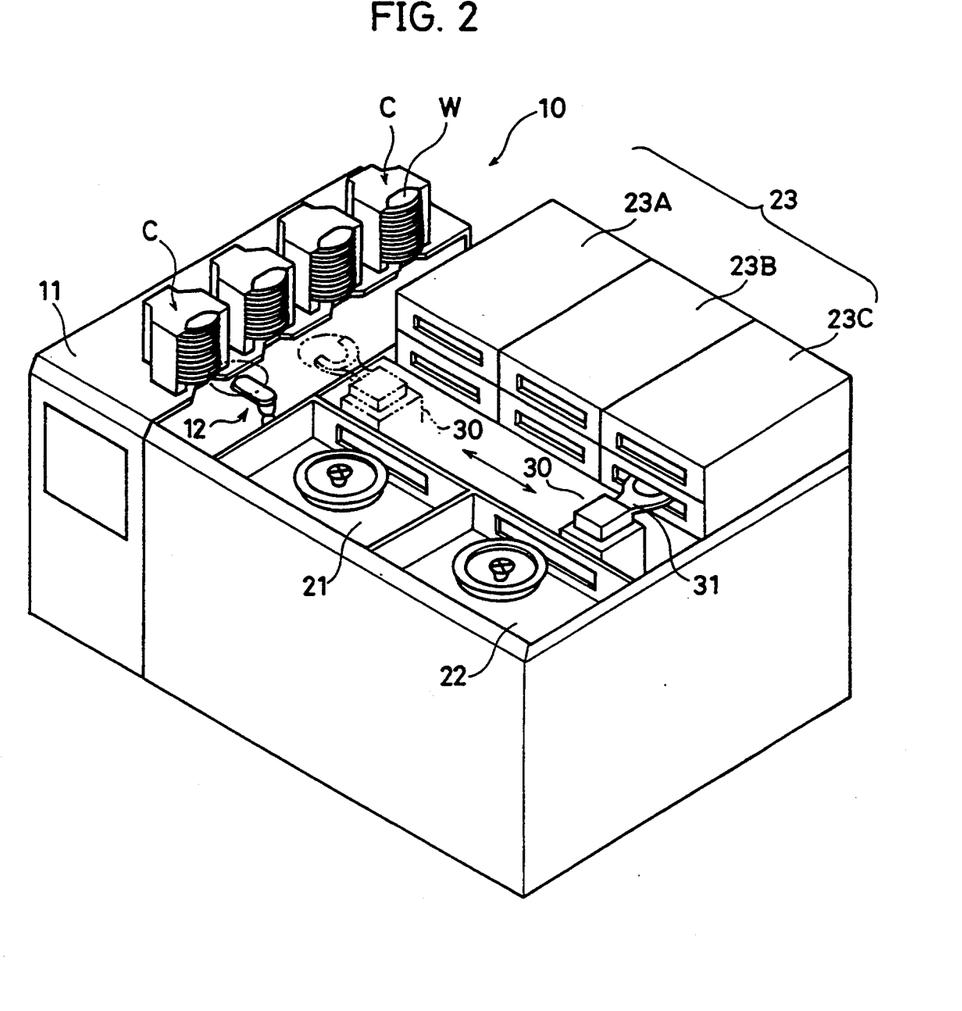
FIG. 2 is a perspective view of a substrate treatment apparatus for implementing a method in accordance with the present invention.

Referring to FIG. 2, a substrate treatment apparatus for implementing a method in accordance with the present invention includes a cassette stop station 10 for stationing a plurality of substrate cassettes C each accommodating a plurality of substrates W; a treatment station having a liquid agent applying unit 21 for applying a prescribed liquid agent such as photoresist, etc. onto the surface of the substrate W; a treatment station having a developing unit 22 for developing the photoresist, etc. applied on the substrate W; a plurality of treatment stations each having an individual one of heat treatment units 23A to 23C for heat-treating the substrates W; and a self-propelled substrate conveying robot 30 for loading and unloading the substrates W sequentially to and from each of units 21–23 C and the substrate accommodation cassettes C.

The cassette stop station 10 includes a cassette stage 11 on which the plurality of substrate cassettes C are disposed, and a self-propelled substrate transferring and receiving robot 12 for transferring and receiving the substrates W between the substrate cassettes C and the substrate conveying robot 30.

The self-propelled substrate conveying robot 30 has an arm 31 for supporting the substrate W. The substrate conveying robot 30 is capable of traveling freely, revolving, and extending and retracting the arm 31. The operation of the substrate conveying robot 30 is controlled by a previously prepared operational program. The substrate conveying robot 30 conveys the substrate W sequentially in a prescribed cycle time period T to each of the treatment units 21 and 22 and the heat treatment units 23A to 23C based on the program.

Figure 3:
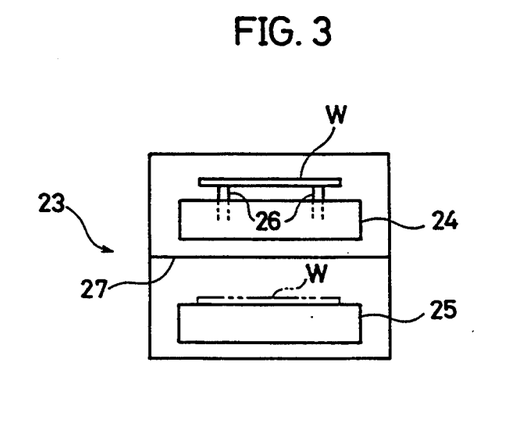
FIG. 3 is a sectional side view schematically showing a substrate heat treatment unit 23A.

The heat treatment units 23A to 23C have the following structures, respectively. Referring to FIG. 3, the heat treatment unit 23A, for example, includes a cool plate 25 for cooling the heated substrate, a heat-insulating separating wall 27 provided over the cool plate 25, and a hot plate 24 provided on the wall 27. Each of the plates 24 and 25 is provided with substrate supporting pins 26 for supporting the substrate W at their upper ends. The substrate supporting pin 26 is capable of moving up and down in a through-hole provided in the plates 24 and 25, which will be described later on.

Figure 4A:
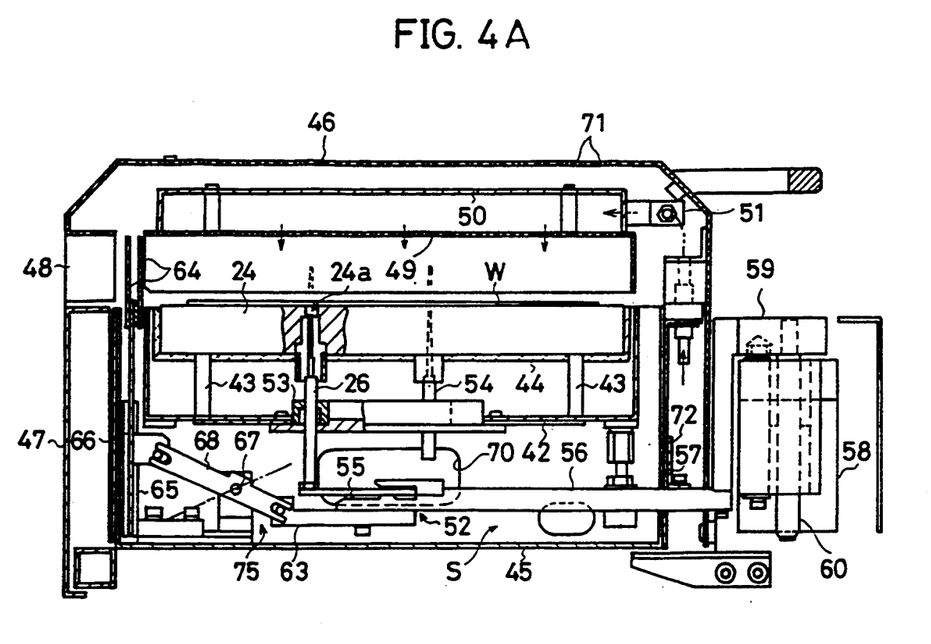
FIGS. 4(A) and 4(B) are sectional side views each showing the substrate heat treatment unit 23A.

FIG. 4(A) is a diagram showing in detail the structure of the hot plate portion of the heat treatment unit 23A. Referring to FIG. 4(A), the heat treatment unit 23A is provided with a square hot plate 24. The hot plate 24 is supported by a stay 43 in a box type heat-insulating cover 42 of stainless steel and has its top detached from the cover 42 by the stay 43. The top of the hot plate 24 is almost flush with the opening of the heat-insulating cover 42. The bottom and the four sides surrounding the hot plate 24 are provided with an heat-insulating layer 44 formed of a porous ceramic material, etc.

The heat-insulating cover 42 is housed in an even larger-size box-type outer wall body 45 opened upwardly. The entire mechanism is covered with a top cover 46 and a surrounding cover 47.

Formed at a side of the top cover 46 (in the left side in FIG. 4(A)) is a substrate inlet/outlet 48 through which a substrate can go in and out. Formed inside the top cover 46 is an inner cover 49 having a plurality of holes so as to cover the hot plate 24 from top. A gas supply duct 50 is provided on the inner cover 49. The gas supply duct 50 supplies into the inner cover 49 an $N_2$ gas, a gas for treating the surface, etc. through the holes, and produce a desired gas atmosphere over the hot plate 24. The gas supply duct 50 is supplied with gases externally through a joint 51.

A space S is formed between the bottom of the cover 42 and the bottom of the outer wall 45, and a substrate elevating mechanism 52 for elevating the substrate W is housed therein. A sliding bracket 53 is formed at the bottom of the heat-insulating cover 42, and the sliding bracket 53 supports three substrate supporting pins 26 slidable up and down and inserted through the sliding bracket 53. The substrate elevating mechanism 52 extends and retracts the substrate supporting pins 26 from and into the top surface of the plate 24 through through-holes 24a formed in the hot plate 24.

The substrate elevating mechanism 52 includes a supporting plate 55 on which the substrate supporting pins 26 stand fixed, and an elevating arm 56 for supporting the supporting plate 55 at its forward end to elevate the supporting plate 55. The other end of the elevating arm 56 extends externally through an opening 57 formed at the outer wall 45. The substrate elevating mechanism 52 further includes a movable member 59 coupled to the elevating arm 56 protruding externally through the opening 57 and capable of moving up and down guided by a pair of parallel guide rods 60, and an air cylinder 58 for elevating the movable member 59.

The substrate inlet/outlet 48 is opened/closed by a shutter 64 moved up and down by a shutter opening/closing mechanism 75. The shutter opening/closing mechanism 75 includes an interlocking arm 63 attached to the bottom of the forward end of the elevating arm 56, a contra rotating link 68 pivotably provided centered on a supporting point 67 and having one end coupled with the interlocking arm 63, and an elevating plate 66 slidable up and down along a pair of guides 65 disposed opposite to each other and coupled with the other end of the contra rotating link 68 for sliding up and down through the guides 65 in accordance with pivotal movement of the contra rotating link 68. The above-mentioned shutter 64 is attached at the upper end of the elevating plate 66.

An exhaust outlet 70 in communication with a suction/exhausting device (not shown) is formed at a part of the side surrounding the bottom of the outer wall 45. A plurality of small holes 71 are formed on the top of the top cover 46. Heated air in the space S between the heat-insulating cover 42 and the outer wall 45 is forcedly exhausted from the exhaust outlet 70 by the suction of the exhaust outlet 70. Outside air is taken to the inside of the cover 46 through the holes 71 in the top cover 46. The air taken in is guided between the heat-insulating cover 42 and the outer wall 45.

To the elevating arm 56 is attached a choking plate 72 for closing the opening 57 of the outer wall 45 at the time of heat treatment, when the substrate supporting pins 54 are retracted.

The substrate elevating mechanism 52 and the shutter driving mechanism 75 of the heat treatment apparatus 23A shown in FIG. 4A operate as follows. During the heat treatment, the air cylinder 58 is retracted and the elevating arm 56 is lowered. The substrate supporting pins 26 retract into the through-holes 24a from the top of the hot plate 24. The substrate W supported by the tips of the substrate supporting pins 26 comes in contact with the top of the hot plate 24, or the substrate W is supported by the substrate supporting pin 26 a very short distance (for example 0.1 to 0.2 mm) apart from the top of the hot plate 24.

When the air cylinder 58 is retracted, the contra-rotating link 68 rotates clockwise centered on the supporting point 67 in FIG. 4(A). One end of the contra-rotating link 68 coupled with the elevating plate 66 is pushed up and the shutter 64 elevates with the elevating plate 66, thereby closing the substrate inlet/outlet 48.

Figure 4B:
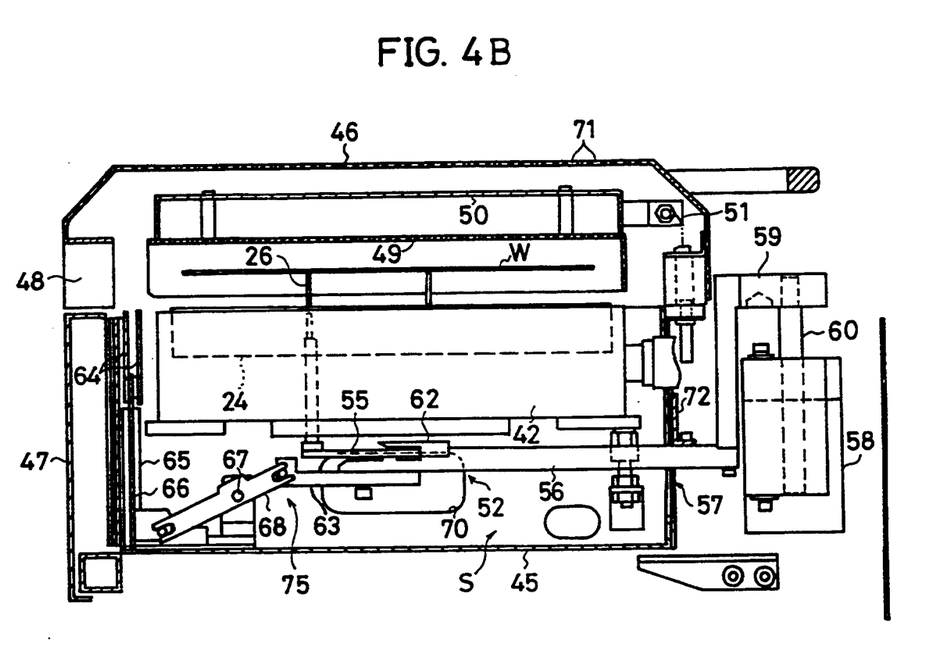

As shown in FIG. 4B, with the extension of the air cylinder 58, the elevating arm 56 elevates. The supporting plate 55 elevates accordingly, and the substrate supporting pins 26 protrude through the hot plate 24. The substrate W is detached from the top of the hot plate 24. The contra-rotating link 68 centered on the supporting point 67 then rotates counterclockwise. The elevating plate 66 and the shutter 64 are lowered, and the substrate inlet/outlet 48 is opened.

FIG. 4(B) shows a state in which the substrate W is pushed up, and the substrate outlet/inlet 48 is opened. The substrate W is detached from the top of the hot plate 24, so that the substrate W is allowed to be conveyed out by the substrate conveying robot 30.

Figure 5:
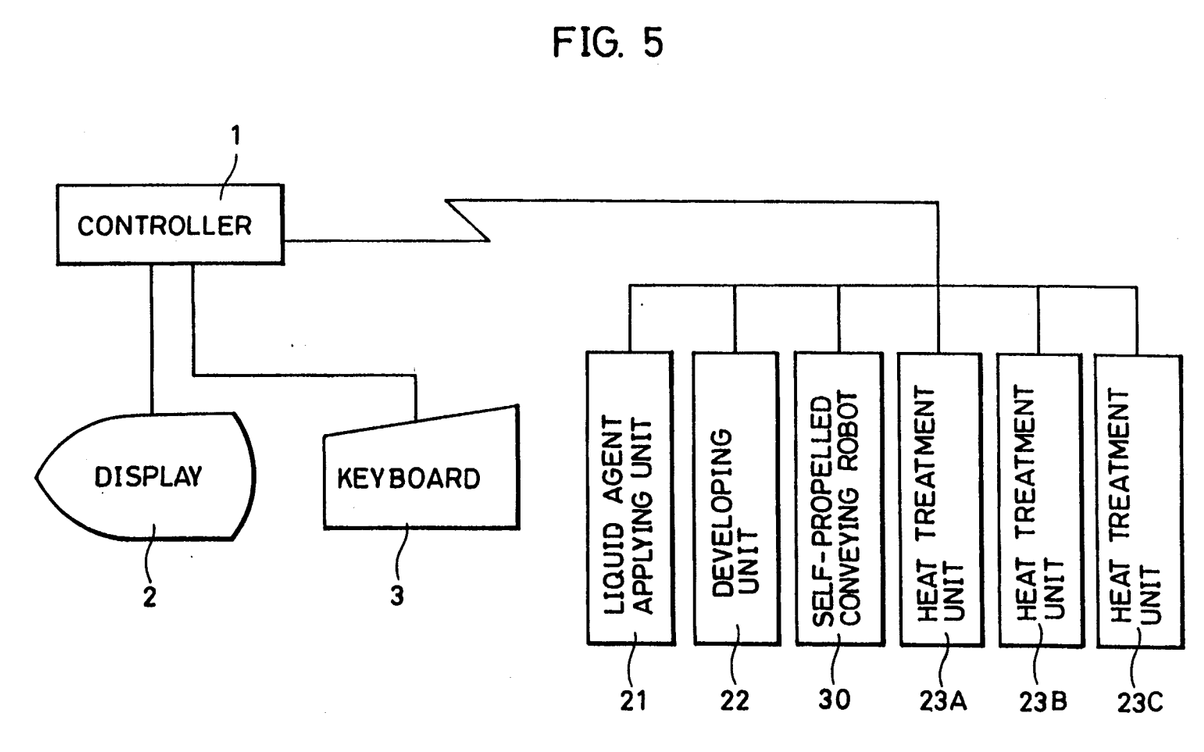
FIG. 5 is a system block diagram showing a substrate treatment apparatus.

Referring to FIG. 5, the liquid agent applying unit 21, the developing unit 22, the self-propelled conveying robot 30, and the heat treatment units 23A to 23C belong to one system, and the system further includes: a controller 1 for controlling units 21 to 23C and the conveying robot 30, a display 2 and a keyboard 3 for interfacing the controller 1 and the operator of the apparatus.

The units 21 to 23C and the conveying robot 30 are each controlled by a program executed by the controller 1.

By the present method, the elevating supporting pins 26 protruding a length of about 10 mm from the hot plate 24 of the heat treatment unit 23A receive the substrate W from the conveying robot 30 when the substrate is heat-treated, and keep the substrate W in a state detached from the hot plate 24 above the hot plate 24 for a time period equal to the time difference between the cycle time period T and the heating time period t. After the above-mentioned time difference elapses, the elevating supporting pins 26 are lowered, to bring the substrate W to a working position in contact with the top of the hot plate 24, or make the substrate approach to a position a very short distance of 0.1 to 0.2 mm apart from the top of the hot plate 24 where substrate W is also in a working position. The substrate W is heated by heat-conduction including heat conduction by the air. The substrate supporting pins 26 once again elevate simultaneously at the end of one cycle time T, thereby detaching the substrate W from the top of the hot plate 24. The raised substrate W is transferred by the self-propelled conveying robot 30 onto the cool plate 25. Thus, the substrate supporting pins 26 and mechanism 52 serve as means for receiving/transferring a substrate from/to the robot 30.

Thus heating the substrate W produces the following effects: The substrate W is at a relatively low temperature when transferred into the heat treatment unit 23A. The temperature increase of the substrate W when it is kept detached from the hot plate 24 above the hot plate 24 is therefore mild. The time period t in which the substrate W is directly heated by the hot plate 24 can be strictly the same as a predetermined time. Immediately after the heating time t elapses, the substrate W can be cooled uniformly by the cool plate 25 (FIG. 3). Accordingly, the overbaking of the substrate W by the remaining heat after the heat treatment can be avoided. Furthermore, temperature disparity does not take place at the hot plate 24, because there is no necessity for providing cold air outlets 124 as shown in FIG. 1 at the hot plate 24.

Figure 6:
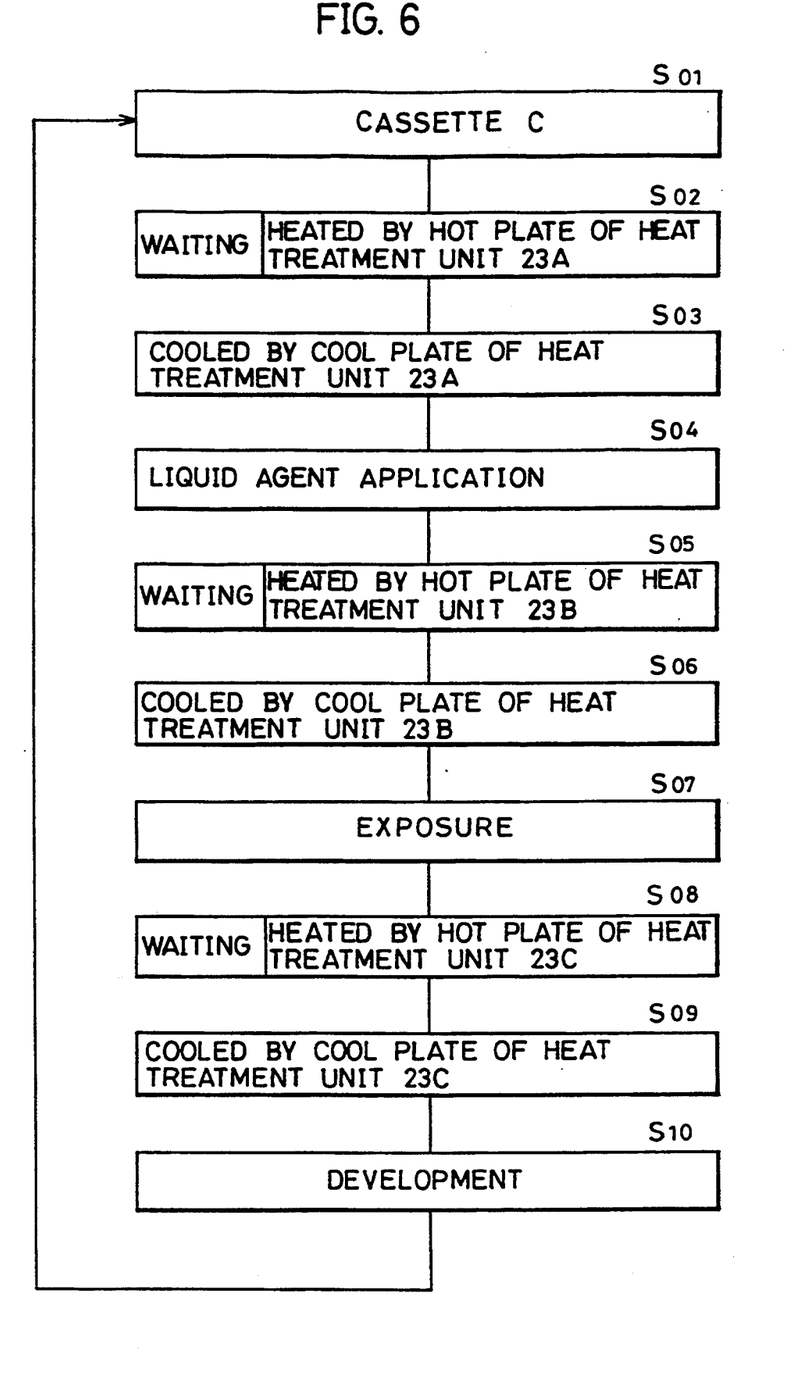
FIG. 6 is a flow chart showing treatment of a substrate in accordance with the present invention.

In the apparatus shown in FIG. 2, the substrate W is treated in accordance with the following process flow. Referring to FIG. 6, the substrate W taken out from the cassette C in step S01 is heated by the hot plate of the heat treatment unit 23A in step S02. Prior to the heating, the substrate W is kept in a standby position detached from the hot plate 24 above the hot plate 24 held by the substrate supporting pin 26 for a time period equal to the time difference T−t1 between a cycle time T and a heating time t1 in the heat treating unit 23A. After the time T−t1 elapses, the substrate W is brought downward to a working position in contact with the hot plate of the heat treatment unit 23A and is then heat-treated. After the prescribed heating time t1 elapses, the substrate is removed from the hot plate of the heat treatment unit 23A, and is transferred onto the cool plate of the heat treatment unit 23A.

In step S03, the substrate W is cooled by the cool plate in a prescribed time period. The time period is usually selected to be equal to the cycle time T.

Then, in step S04, the substrate W is removed from the cool plate of the heat treatment unit 23A, and is conveyed into the liquid agent applying unit 21 including a spin coater, etc., so that a liquid agent such as photoresist is applied onto the surface thereof. After the completion of the liquid agent application, the substrate W is conveyed onto the hot plate part of the heat treatment unit 23B by the substrate conveying robot 30.

In step S05, the substrate W is heated by the hot plate of the heat treatment unit 24B in order to bake the photoresist. Prior to the heating, the substrate W is held detached from the hot plate 24 above the hot plate 24 by the substrate supporting pins 26 (see FIG. 3) protruding from the hot late of the heat treatment unit 24B for a time period equal to the time difference T−t2 between the cycle time T and a heating time t2 required for baking the photoresist. The temperature of the substrate W is relatively low at this time. Although the substrate W is heated by heat radiated from the hot plate 24, the temperature rise due to the heat is relatively slow. After the time T−t2 elapses, the substrate supporting pins 26 descend, thereby placing the substrate W on the hot plate 24. The substrate W is heated by the hot plate 24 for the heating time period t2. When the heating time t2, i.e. the cycle time T runs out, the substrate W is raised by the substrate supporting pins 26 from the hot plate 24. The substrate conveying robot 30 transfers the substrate W using the arm 31 onto the cool plate of the heat treatment unit 24B.

In step S06, the substrate W is cooled by the cool plate of the heat treatment unit 24B. The cooling time is also usually selected to be equal to the cycle time T.

In step S07, the substrate W is removed from the cool plate of the heat treatment unit 24B, and is sent to an exposure device (not shown). A prescribed pattern of exposure is performed on the photoresist in this exposure device. After the exposure is completed, the substrate conveying robot 30 takes out the substrate W from the exposure device, and conveys the substrate W onto the hot plate of the heat treatment unit 23C.

In step S08, the hot plate of the heat treatment unit 23C heat-treats the substrate W after the exposure of the substrate W. Prior to this heat treatment, the substrate W is held detached from the hot plate 24 on the tips of the substrate supporting pins 26 protruding from the hot plate 24 (see FIG. 3) for a time period equal to the time difference T−t3 between the cycle time T and a prescribed heating time period t3 for baking after the exposure. After the time T−t3 elapses, the substrate supporting pins 26 withdraw into the hot plate 24, and the substrate W is placed on the hot plate 24. The substrate W is heated for the time period t3 by the hot plate 24. After the heating time t3 is over, i.e. the cycle time T runs out, the substrate supporting pins 26 once again elevate, and the substrate W is raised up from the hot plate 24. The substrate conveying robot 30 takes out the substrate from the hot plate 24 and places the same onto the cool plate of the heat treatment unit 23C.

In step S09, the substrate is cooled by the cool plate of the heat treatment unit 23C for a prescribed period of time, usually for a cycle time T. After the prescribed time elapses, the substrate W is removed from the cool plate of the heat treatment unit 23C and is transferred into the developing unit 22. The developing unit 22 has a spin developing machine, etc., and develops the exposed and baked photoresist with prescribed developing agent. After the development is completed, the substrate W is once again stored in the cassette C by the substrate conveying robot 30.

In the description of the case shown in FIG. 6, either the application of the liquid agent in step S04, the exposure treatment in step S07, or the developing treatment in step S10 defines the cycle time T. In practice, however, treatment for baking photoresist (step S05), for example, may require longest period of time, and therefore, defines the cycle time T. In such a case, the cycle time T equals t2, and the substrate W is immediately placed on the hot plate without going through any waiting treatment in step S05.

Figure 7:
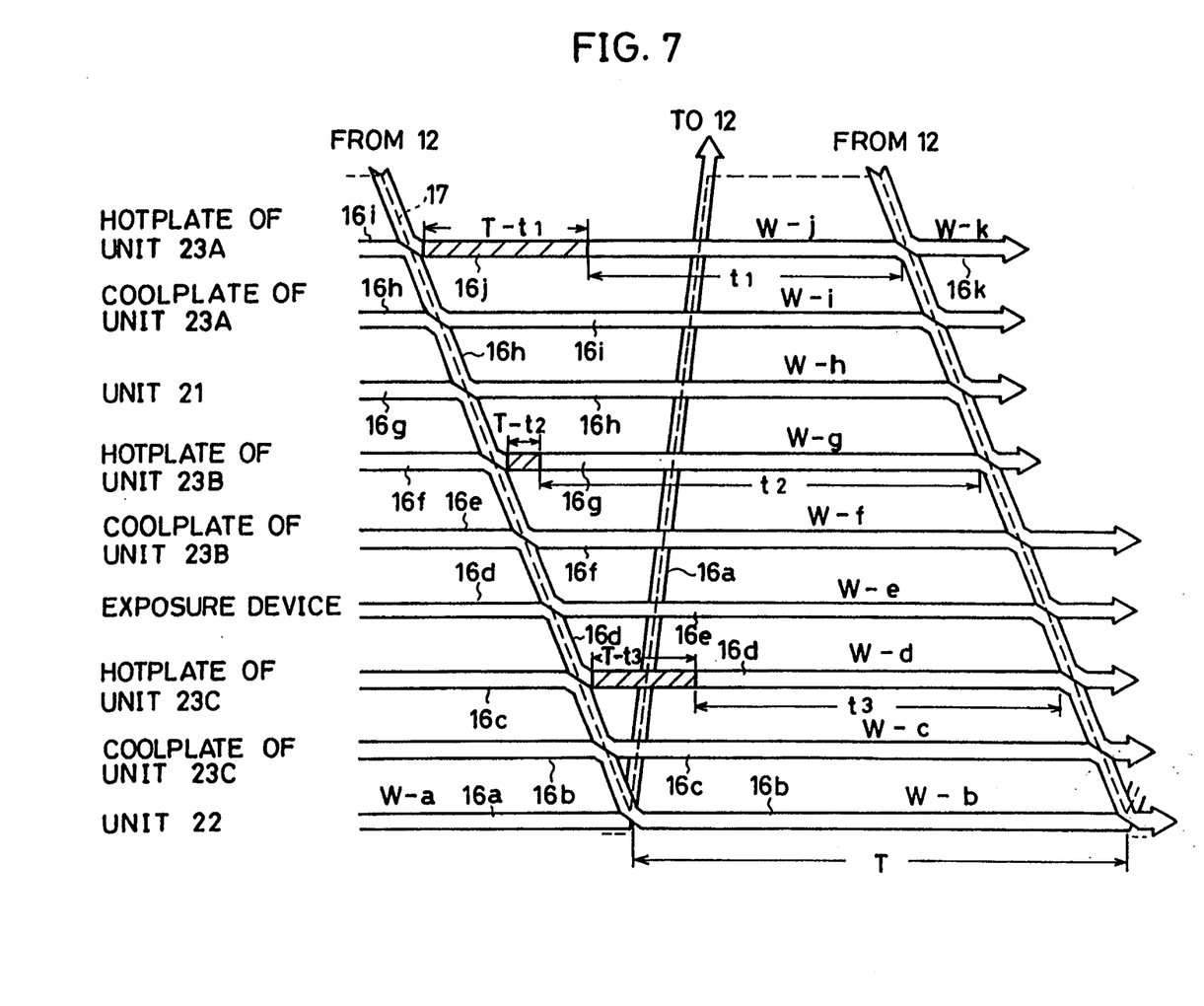
FIG. 7 is a diagram showing movement of the substrate and the substrate conveying robot in the apparatus shown in FIG. 2.

FIG. 7 is a diagram showing changes against time of the position of the substrate W in the apparatus treated in accordance with the process flow in FIG. 6 and the position of the substrate conveying robot 30.

In FIG. 7, the ordinate represents the position of each unit, and the abscissa represents time elapsed. A white arrow represents time change in the position of each of the substrates W. Also in FIG. 7, the movement of the substrate conveying robot 30 (FIG. 2) in the apparatus is represented by a dotted line 17.

A white arrow 16e shown in FIG. 7, for example, indicates the process in which after the heating and cooling treatment by the unit 23A, the application of the liquid agent by the unit 21, and the heat treatment by the hot plate of the unit 23B, the substrate W-e undergoing the cooling treatment by the cool plate of the heat treatment unit 23B is removed from the cool plate of the unit 23B by the substrate conveying robot 30 coming from the hot plate of the unit 23B, then conveyed onto the exposure device (not shown), and after the exposure, is further conveyed onto the hot plate of the unit 23C. As can be apparent from the figure, the substrate W is thereafter heated by the hot plate of the unit 23C, cooled by the cool plate of the unit 23C and conveyed onto the cassette C after being developed by the developing unit 22.

Similarly a white arrow 16j indicates the process in which the substrate W-j removed by the substrate transferring and receiving robot 12 is passed to the substrate conveying robot 30, and after conveyed onto the hot plate of the unit 23A and heated, the substrate undergoes a series of treatments following the cooling treatment by the cool plate of the unit 23B.

As shown in FIG. 7, the substrate conveying robot 30 takes out the substrate W from each unit along the path represented by the dotted line 17, and conveys the substrate W to the subsequent units. The robot 30 conveys the substrate W developed by the developing unit 22 onto the substrate transferring and receiving robot 12, and receives the next substrate W from the substrate transferring and receiving robot 12 to repeat once again the series of treatments.

As can be seen from FIG. 7, the conveying robot 30 travels around each unit for every cycle time T. It is assumed that heating is performed at each hot plate of the heat treatment units 23A, 23B and 23C for prescribed heating times t1, t2 and t3, respectively. Prior to the heat treatment, the substrate W is held in place above the hot plate by the substrate supporting pins, and is detached from the top of the hot plate for a time period T−t1, a time period T−t2, and a time period T−t3 at the units 23A, 23B and 23C, respectively. The substrate W is therefore not heated directly by the hot plate 24 during these periods. The temperature rise of the substrate W is mild, and therefore there is little chance of overbaking. The heating of the substrate W by each hot plate of the units 23A, 23B and 23C is completed simultaneously with elapse of the cycle time T at each of the units, and the substrate W is immediately taken into the succeeding cooling treatment by the conveying robot 30. Overbaking by the hot plate after the heating, and overbaking by the remaining heat of the substrate W itself are most unlikely.

The applicant made an experiment as follows in order to examine the effects of the above-mentioned method using the heat treatment apparatus shown in FIG. 2: First, 60 pieces of substrates are prepared. Under a prescribed identical condition, photoresist is applied to all of these substrates. Among these substrates, the first twenty substrates were heated under a condition shown in FIG. 8. The second twenty substrates were heated in accordance with a conventional method shown in FIG. 9. The last twenty substrates were heated by a method in accordance with present invention shown in FIG. 10. All the heat-treated substrates were cooled to a prescribed temperature (23° C.), and a pattern having a line width of 1.5 μm is provided thereon. After developing all the substrate under the same condition, the line widths of the resultant patterns were observed and compared.

Figure 8:
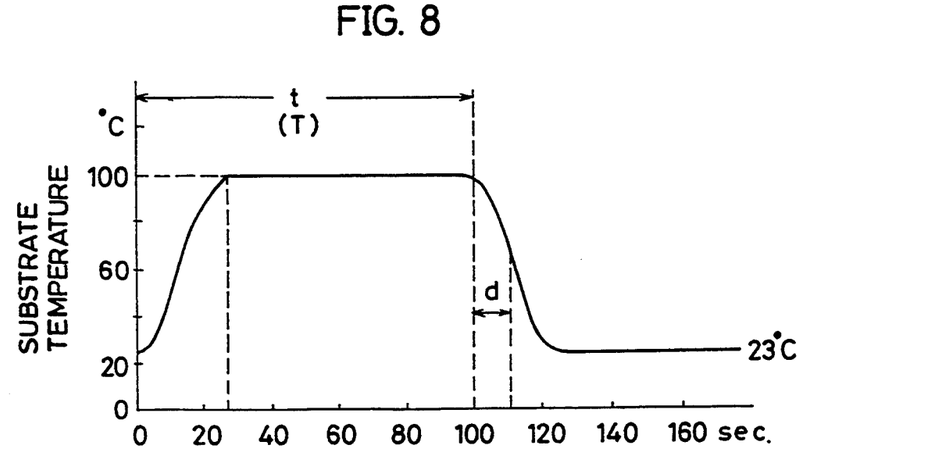
FIG. 8 is a graphic representation showing the temperature changes of a substrate when a cycle time T equals a heating time t.

FIG. 8 shows the temperature change of the substrate when the cycle time T equals a prescribed heating time t for baking the substrate. In this case, it is set that the time T=100 sec.

Figure 9:
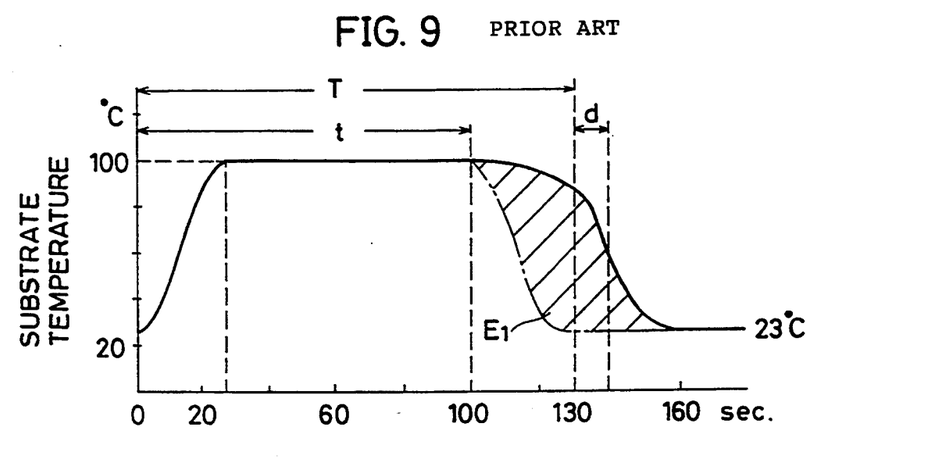
FIG. 9 is a graphic representation showing the temperature changes of a substrate heat-treated by a conventional method.

FIG. 9 shows the temperature change of the substrate when the substrate W is heat-treated as follows using the conventional apparatus shown in FIG. 1: After heating the substrate W for a prescribed heating time t, the substrate W is detached from the hot plate 124 by the substrate supporting pins 126 (FIG. 1), and is kept in that state until the end of the cycle time T. Cold air was not supplied in order to keep the temperature of the hot plate 124 stable.

Figure 10:
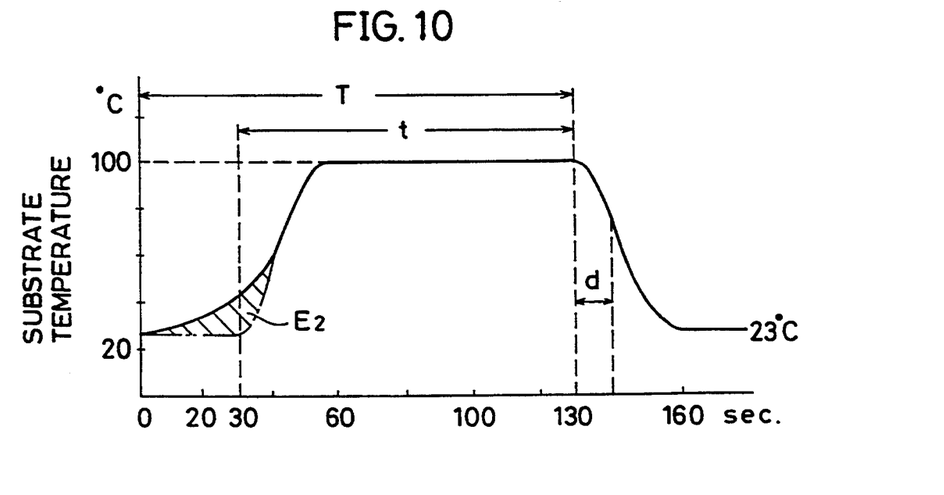
FIG. 10 is a graphic representation showing the temperature changes of a substrate heat-treated by a method in accordance with the present invention.

FIG. 10 shows the temperature change of the substrate W when the substrate is heat-treated in accordance with the present invention. In other words, the substrate W was held by the substrate supporting pins, and was detached from the hot plate above the hot plate for the time T−t prior to the heat treatment when a prescribed heating time t is shorter than the cycle time T. The substrate W was thereafter placed on the hot plate, and was heated for the time period t. After the elapse of the time period t, i.e. at the end of the cycle time T, the substrate W was removed from the hot plate, and was transferred onto the cool plate.

In each of the experiments as described above, the temperature of the hot plate is set to be 100° C., and the temperature of the cool plate is set to be 23° C. The heating time t is set to be 100sec. the cycle time T is set to be 100sec. in the case shown in FIG. 8, and 130sec. in the cases shown in FIGS. 9 and 10, respectively. The heat-treated substrate W is transferred onto the cool plate immediately after the elapse of the cycle time T. A time interval d in FIG. 8–FIG. 10 represents time required for transferring the substrate W from the hot plate to the cool plate. In these cases, the period d was 10sec.

FIG. 8 is supposed to represent an ideal case in which the cycle time T and the heating time t coincide as described above. Therefore, it can be understood that the method in accordance with the present invention shown in FIG. 10 is superior to the conventional method, by studying which of the heating conditions shown in FIG. 9 and FIG. 10 is closer to the condition shown in FIG. 8.

In comparison between FIG. 9 and FIG. 8, the substrate W is excessively heated by a heat amount corresponding to the shadowed portion E1 in accordance with the conventional method. On the other hand, in comparison between FIG. 10 and FIG. 8, the substrate W is excessively heated by a heat amount equal to the shadowed portion E2 under the condition shown in FIG. 10. The temperature of the substrate is about 23°

C. before the heat treatment. The substrate receives a very small amount of heat from the hot plate during this period, because the substrate stands detached from the hot plate. It is apparent that after the substrate is detached from the hot plate, a more preferable result is provided in accordance with the method of the present invention than in the case shown in FIG. 9 in which the substrate is overbaked by the remaining heat of the substrate itself.

The results of the experiments confirmed the above-described assumptions. In other words, the applicant obtained the following results:

The resultant line width is
(1) 1.50 μm in the substrate treated in accordance with the condition shown in FIG. 8,
(2) 1.54 μm in the substrate heat-treated under the condition shown in FIG. 9, and
(3) 1.51 μm in the substrate heat-treated under the condition shown in FIG. 10.

In other words, even if a cycle time period T does not agree with a prescribed heating time t, a heat amount excessively applied to the substrate is small in accordance with the present invention, and is hardly different from the one treated under an ideal condition.

In the above described embodiments, the method is described by which the substrate is transferred to the cool plate and cooled to the atmosphere temperature immediately after the cycle time T elapses, considering stability or efficiency in the heat treatment. However, this is only one example, and the present application is by no means limited thereto.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of heat treating a substrate in a substrate treatment apparatus that includes a plurality of treatment stations and a single substrate conveying means for conveying and supplying said substrate sequentially to said plurality of treatment stations, and for unloading said substrate after treatment that takes place at each of said stations for at least part of a prescribed cycle time period during which said substrate conveying means traverses a path along which said plurality of treatment stations are located, a first of said stations including substrate heating means for heating said substrate to a prescribed temperature, and substrate transferring and receiving means for transferring said substrate between said substrate conveying means and said substrate heating means, said method comprising the steps of:

transferring said substrate from said substrate conveying means to said substrate transferring and receiving means;

placing said substrate transferred to said substrate transferring and receiving means within said first of said stations;

holding said substrate within said first of said treatment stations in a standby position, said substrate being held in said standby position such that relatively little heat passes to said substrate from said substrate heating means, said substrate being held in said standby position within said first of said treatment stations for a predetermined first time period shorter than said cycle time period;

moving said substrate from said standby position toward said substrate heating means to a working position after said first predetermined time period expires wherein transfer of heat to said substrate from said substrate heating means is relatively rapid;

maintaining said substrate at said working position for a predetermined second time period that terminates as soon as said cycle time period ends; and unloading said substrate from said substrate heating means as soon as said second time period elapses by utilizing said substrate transferring and receiving means whereby heating of said substrate by said substrate heating means ceases.

2. The method in accordance with claim 1, wherein said second time period is predetermined as a heating time for ideally heat-treating said substrate.

3. The method in accordance with claim 1, wherein said substrate conveying means comprises a self-propelled substrate conveying robot.

4. The method in accordance with claim 1, wherein said substrate heating means comprises a hot plate having a flat top and first, second and third through-holes, one of said through-holes being disposed remote from a straight line that extends between the others of said through-holes, and said substrate transferring and receiving means comprises:

individual substrate supporting pins each slidably inserted into each of said through-holes for supporting the bottom surface of said substrate at their upper ends, and substrate elevating means provided below said hot plate for elevating said substrate supported by said substrate supporting pins by elevating and lowering said three substrate supporting pins while keeping the upper end of each pin at the same level as the upper ends of the other pins.

5. The method in accordance with claim 4, wherein said substrate transferring and receiving step comprises the steps of:

positioning said substrate at said standby position, which is a predetermined distance above said top of said hot plate, by said substrate conveying means so that the bottom of said substrate is approximately level; and elevating said substrate supporting pins by said substrate elevating means to such a position that the upper ends of said substrate supporting pins support the bottom of said surface.

6. The method in accordance with claim 5, wherein said step of holding said substrate in said standby position for said first time period comprises a step of keeping said pins standing still for said first time period after receiving said substrate from said substrate conveying means.

7. The method in accordance with claim 6, wherein said step of heating said substrate by said substrate heating means for said second time period comprises the steps of:

lowering said substrate supporting pins by said substrate elevating means and disposing the substrate supported by said substrate supporting pins at said working position wherein the substrate is at the top of said hot plate;

keeping said substrate on the top of said hot plate for said second time period; and raising said substrate to such a level that said substrate conveying means can receive said substrate by elevating said substrate supporting pins by said substrate elevating means again after said second time period elapse.

8. The method in accordance with claim 1, wherein said substrate treatment apparatus further comprises substrate cooling means for cooling said substrate to a prescribed temperature, said substrate cooling means being remote from said substrate heating means, said method further comprising the steps of:

conveying said substrate removed from said substrate heating means to said substrate cooling means by said substrate conveying means; and cooling said substrate for a prescribed time period by said substrate cooling means.

9. The method in accordance with claim 8 in which cooling said substrate by said substrate cooling means takes place for a time period equal approximately to said cycle time period.

10. The method in accordance with claim 8, wherein the substrate is cooled by said cooling means to a predetermined temperature immediately after heating is completed at the end of the second time period.

11. The method in accordance with claim 10, wherein the substrate is cooled immediately following completion of heating at the end of the second time period.

12. The method in accordance with claim 1 wherein when said substrate is in said working position said substrate is in contact with the substrate heating means.

13. The method in accordance with claim 1 wherein when said substrate is in said working position said substrate and said substrate heating means are closely spaced.

14. The method in accordance with claim 13 wherein said transferring and receiving means supports said substrate when the latter is in said working position.

15. The method in accordance with claim 1, further comprising the step of immediately moving said substrate from said working position back to said standby position after the end of said second time period.

16. The method in accordance with claim 1, wherein said substrate treatment apparatus is a photoresist processing apparatus.

17. The method in accordance with claim 1, wherein said substrate treatment apparatus includes a liquid agent applying unit, said method further comprising the step of applying liquid agent to a surface of said substrate.

18. A method of heat treating a substrate in a substrate treatment apparatus that includes a plurality of treatment stations and a self-propelled substrate conveying robot for conveying and supplying said substrate sequentially to said plurality of treatment stations, and for unloading said substrate after treatment that takes place at each of said stations for at least part of a prescribed cycle time period during which said substrate conveying robot traverses a path along which said plurality of treatment stations are located, a first of said stations including substrate heating means for heating said substrate to a prescribed temperature, and substrate transferring and receiving means for transferring said substrate between said substrate conveying robot and said substrate heating means, said method comprising the steps of:

transferring said substrate from said substrate conveying robot to said substrate transferring and receiving means;

placing said substrate received by said transferring and receiving means within said first of said treatment stations;

holding said substrate in a standby position within said first of said treatment stations, said substrate being held in said standby position such that relatively little heat passes to said substrate from said substrate heating means, said substrate being held in said standby position within said first of said treatment stations for a predetermined first time period shorter than said cycle time period;

moving said substrate from said standby position toward said substrate heating means to a working position after said first predetermined time period expires wherein transfer of heat to said substrate from said substrate heating means is relatively rapid;

maintaining said substrate at said working position for a predetermined second time period that terminates as soon as said cycle time period ends; and unloading said substrate from said substrate heating means as soon as said second time period elapses by utilizing said substrate transferring and receiving means, whereby heating of said substrate by said substrate heating means ceases.

19. A method of heat treating a substrate in a photoresist processing apparatus that includes a plurality of treatment stations and a single substrate conveying means for conveying and supplying said substrate sequentially to said plurality of treatment stations, and for unloading said substrate after treatment that takes place at each of said stations for at least part of a prescribed cycle time period during which said substrate conveying means traverses a path along which said plurality of treatment stations are located, a first of said stations including substrate heating means for heating said substrate to a prescribed temperature, and substrate transferring and receiving means for transferring said substrate between said substrate conveying means and said substrate heating means, said method comprising the steps of:

transferring said the substrate from said substrate conveying means to said substrate transferring and receiving means;

placing said substrate received by said transferring and receiving means within said first of said treatment stations;

holding said substrate in a standby position within said first of said treatment stations, said substrate being held in said standby position such that relatively little heat passes to said substrate from said substrate heating means, said substrate being held in said standby position within said first of said treatment stations for a predetermined first time period shorter than said cycle time period;

moving said substrate from said standby position toward said substrate heating means after said first predetermined time period expires to a working position wherein transfer of heat to said substrate from said substrate heating means is relatively rapid;

maintaining said substrate at said working position for a predetermined second time period that terminates as soon as said cycle time period ends; and unloading said substrate from said substrate heating means as soon as said second time period elapses by utilizing said substrate transferring and receiving means whereby heating of said substrate by said substrate heating means ceases, the sum of said first time period and said second time period being equal to said cycle time period.

20. The method in accordance with claim 19, wherein said substrate is in said standby position before said substrate is removed from the first of said treatment stations;

said method further comprising the steps of:

immediately moving said substrate from said working position back to said standby position after the end of said second time period; and immediately moving said substrate from said standby position to said substrate conveying means after the end of said cycle time period.

* * * * *